US005497219A

United States Patent [19]

Kurokawa et al.

[11] Patent Number: 5,497,219

[45] Date of Patent: Mar. 5, 1996

[54] CHARGE ROLLERS HAVING IMPROVED LAYER STRUCTURE AND/OR SURFACE CHARACTERISTICS IN AN IMAGE FORMING APPARATUS

[75] Inventors: Junji Kurokawa, Yokohama; Kazuo Nojima, Chiba; Masaki Sekizawa, Kawasaki, all of Japan

[73] Assignee: Ricoh Company, Ltd., Tokyo, Japan

[21] Appl. No.: 228,380

[22] Filed: Apr. 15, 1994

[30] Foreign Application Priority Data

May 31, 1993 [JP] Japan .................................... 5-154481
Dec. 22, 1993 [JP] Japan .................................... 5-346527

[51] Int. Cl.[6] ...................................................... G03F 15/02

[52] U.S. Cl. ............................................. 355/219; 361/225

[58] Field of Search ............................ 355/219; 361/225; 430/902

[56] References Cited

U.S. PATENT DOCUMENTS

| | | | |
|---|---|---|---|
| 5,272,506 | 12/1993 | Goto et al. | 355/219 |
| 5,390,007 | 2/1995 | Kugoh et al. | 355/219 |

FOREIGN PATENT DOCUMENTS

| | | | |
|---|---|---|---|
| 0534437 | 3/1993 | European Pat. Off. | 355/219 |
| 2-198468 | 8/1990 | Japan | 355/219 |
| 3-249777 | 11/1991 | Japan | 355/219 |
| 4-177377 | 6/1992 | Japan | 355/219 |

*Primary Examiner*—Joan H. Pendegrass
*Attorney, Agent, or Firm*—Oblon, Spivak, McClelland, Maier & Neustadt

[57] ABSTRACT

An image forming apparatus including a charge roller for providing a charge to a photoconductive member. The charge roller includes a metallic core with a conductive elastic layer covering the metallic core and a surface layer covering the elastic layer. The conductive elastic layer is preferably formed of an epichlorohydrein rubber or a urethane rubber. In addition, the conductive elastic layer and surface layer preferably have thickness and roughness characteristics as discussed herein.

26 Claims, 4 Drawing Sheets

CHARGE ROLLERS HAVING IMPROVED LAYER STRUCTURE AND/OR SURFACE CHARACTERISTICS IN AN IMAGE FORMING APPARATUS

BACKGROUND OF THE INVENTION

1. Field of the Invention

The invention relates to a copier, printer, facsimile machine or other image forming apparatus, and particularly to a charging device therefor. More specifically, the invention relates to an image forming apparatus which utilizes a charge roller for uniformly charging the surface of a photoconductive element, or image carrier, during a sequence of image forming steps.

2. Discussion of the Background

In a conventional image forming apparatus, a corona discharger is commonly utilized as a charging device for uniformly charging the surface of a photoconductive element or photoconductive member. A corona discharger effectively and uniformly charges the surface of a photoconductive element to a predetermined potential. However, corona dischargers are disadvantageous in that they require a high-tension power source and generate ozone during the discharge. Ozone generated in large quantities not only pollutes the environment but also accelerates deterioration of the charging member and the photoconductive element.

In view of the above problems, it has been proposed to utilize a charge roller in lieu of the corona discharger. With this type of charging device, a charge roller is held in contact with and driven by a photoconductive drum. The charge roller includes a magnetic core, and a voltage is applied from a power source to the core of the charge roller, such that the roller charges the surface of the drum. Using the charge roller, it is possible to lower the required voltage of the power source and reduce the amount of ozone ascribable to charging. In addition, the charge roller prevents dust particles from being electrostatically deposited on a corona wire, and eliminates the need for a high tension power source. However, the problem with this type of charger arrangement is that the charge distribution can become irregular, and the charge potential is extremely susceptible to environmental effects. In fact, such a charging arrangement is typically inferior to the corona charger arrangement with respect to the uniformity of the charge distribution.

Japanese Patent Laid-Open Publication No. 149668/1988 (referred to herein as the '668 system) teaches an arrangement to improve the uniformity of the charge superposing an AC voltage having a peak-to-peak voltage more than twice as high as a charge start voltage (Vth) in combination with the application of a DC voltage. However, the '668 system requires an AC power source in addition to a DC power source to thereby provide the superposed AC voltage together with the DC voltage, thus increasing the cost of the apparatus. Moreover, a great amount of AC current not contributing to the charge potential of the photoconductive element is consumed, thus reducing the efficiency of the apparatus. In addition to increasing the running and manufacturing cost of the apparatus, this arrangement also generates a great amount of ozone, which is problematic not only with respect to pollution of the environment, but also in aggravating or accelerating the deterioration of the charging member as well as the photoconductive element.

One type of charge roller to which only a DC voltage is applied includes an elastic layer formed of synthetic rubber with carbon dispersed therein. A problem with this type of charge roller (synthetic rubber with dispersed carbon) to which only a DC voltage is applied is that the resulting withstand voltage (i.e., the maximum voltage which the roller can withstand) of the charge roller tends to become weak.

In the conventional conductive elastic layer formed of a synthetic rubber and dispersed carbon, the electrical resistance is adjustable by varying the amount of added carbon to the synthetic rubber. However, it is difficult to satisfy both the electrical conductivity and the voltage requirements of the elastic layer at the same time. A typical electrical conductivity is a moderate $10^8$ Ω-cm. From a microscopic point of view, the electrical conductivity of carbon is quite different from that of the synthetic rubber. Therefore, an irregular charge distribution in the elastic layer of the charge roller occurs, and the withstand voltage of the elastic layer diminishes.

An additional problem with conventional charge rollers is that, during a stop mode or a non-operating period of time, conventional charge rollers are held in pressure contact with the photoconductive drum. As a result of this contact over a period of time, an abnormal image, such as an image with an undesirable lateral strip of toner or developer, is produced in the first copying operation (i.e., the first copy after an extended inoperative period). In addition, if the charge roller is in use over an extended period, undesirable toner becomes attached to the surface of the charge roller, and the capacity or ability of the charge roller to charge the photoconductive drum is thereby deteriorated.

Japanese Patent Laid-Open Publication No. 194061/1983 (referred to hereinafter as the '061 arrangement) teaches the use of a cleaning member for scraping undesired toner from the charge roller provided in the vicinity of the charge roller. In addition, a non-binding or non-adhering film is provided to avoid adherence of toner onto the surface of the charge roller. However, a problem with the '061 arrangement is that an irregular charge distribution results on the charge roller, and the level of the surface voltage of the charge roller is inadequate or less than desirable.

Japanese Patent Laid-Open Publication No. 222985/1990 (refereed to hereinafter as the '985 arrangement) discloses an electrophotographic apparatus which includes a photosensitive member and a charging member disposed in contact with the photosensitive member. The photosensitive member is charged by a voltage applied to the charging member. A ten-point mean (i.e., the average at ten location points) surface roughness (Rz1) of the photosensitive member and the ten-point mean surface roughness (Rz2) of the charging member satisfy the following relationships:

$$0.1\ \text{micron} < Rz1 + Rz2 < 6.0\ \text{microns};$$

$$0.05\ \text{micron} < Rz1 < 5.0\ \text{microns};$$

and $$0.05\ \text{micron} < Rz2 < 5.0\ \text{microns}.$$

A rough surface is formed on the photosensitive member and the charging member by mechanical grinding to thereby lower the starting point or threshold point of discharge on the charging member. The capacity of the surface voltage of the charging member is thereby improved, and a more uniform charge distribution is attained as shown by the flatness of a surface voltage curve in a graphical representation of the surface voltage of the charging member. However, a problem with the '985 arrangement is that the non-binding or the non-adherence characteristics of the charging member with respect to the photosensitive member are not satisfactory, and the adherence of toner to the charging member is also not satisfactory.

SUMMARY OF THE INVENTION

It is therefore an object of the present invention to provide an image forming apparatus and charging device which is advantageous from a cost standpoint of the apparatus itself, as well as the associated power source requirements, with the apparatus also having reduced ozone levels generated during operation thereby preventing the charging member and photoconductive element from deteriorating and also avoiding environmental pollution.

It is another object of the present invention to provide an image forming apparatus and charging device having improved adherence or binding characteristics of the charging member with respect to the photoconductive member, and also suitable adherence characteristics of the charging member with respect to toner utilized in developing an image.

It is a further object of the present invention to provide an image forming apparatus and a charging device therefor having advantageous durability characteristics.

The present invention attains the above objectives and avoids problems associated with conventional arrangements. In accordance with the present invention, it has been recognized that the charge roller can be advantageously formed to have a single elastic layer formed of a polar synthetic rubber with a medium or moderate electrical resistance of $10^7$– $10^{10}$ Ω-cm. The polar synthetic rubber is an epichlorohydrein rubber, such that only a DC voltage need be applied from a power source to the charge roller. Thus, it is not necessary to provide an AC power source which superposes an AC voltage on DC voltage.

In accordance with the present invention, it has been recognized that irregular charge distributions formed in charge rollers to which only a DC voltage was applied results from the formation of the elastic layer having dispersed carbon therein. The non-uniformity of the dispersion of carbon in the synthetic rubber has been recognized as resulting in the non-uniform electrical charge distribution on the conductive elastic layer of the charge roller. As a result, the elastic layer of the charge roller (of synthetic rubber having carbon dispersed therein) has been replaced in accordance with the present invention with an elastic layer having a polar synthetic rubber such as an epichlorohydrein rubber of an average (or medium) electrical resistance. As a result, the electrical charge distribution on the conductive elastic layer is more uniform. Further, the withstand voltage of the charge roller is improved utilizing the epichlorohydrein rubber in the elastic layer in lieu of the conventional synthetic rubber and dispersed carbon. Moreover, the characteristics of the epichlorohydrein rubber from the JISA (Japan Industrial Standard Type A K6301) is 40, which is relatively high, and has a relatively low amount of elastic deformation and thus a high mechanical strength. Further, in accordance with the present invention, an image forming apparatus having advantageous surface characteristics with respect to the non-adherence of toner to the charge roller, as well as the non-adherence of the charge roller and photoconductive element.

BRIEF DESCRIPTION OF THE DRAWINGS

A more complete appreciation of the present invention and many of the attendant advantages thereof will be readily obtained from the following detailed description, particularly when considered in connection with the accompanying drawings, in which.

DESCRIPTION OF THE PREFERRED EMBODIMENTS

Figure 7A:
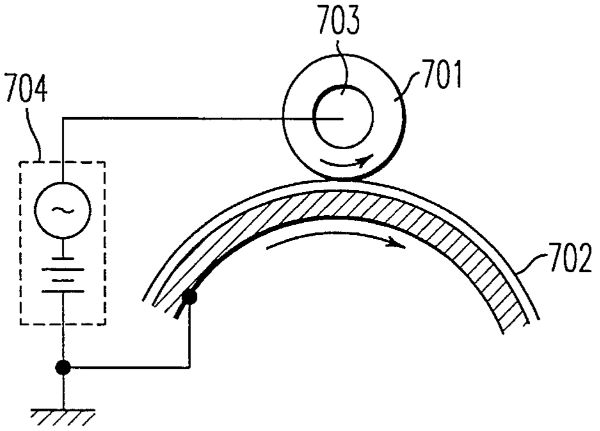
FIGS. 7(*a*)–(*b*) are sections of a conventional charging device in an image forming apparatus.
Figure 7B:
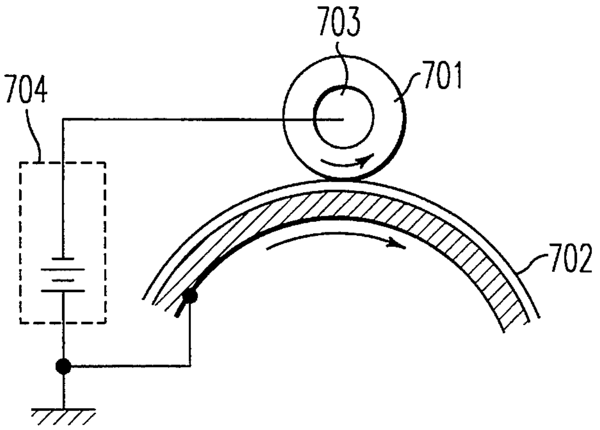

Referring now to the drawings, wherein like reference numerals designate identical or corresponding parts throughout the several views, a conventional charging device will be first described with reference to FIGS. 7 and 8. The charging device of FIGS. 7(*a*)–(*b*) includes a charge roller 701 held in contact with and driven by a photoconductive drum 702. The charge roller 701 includes a metallic core 703. As voltage is applied from a power source 704 to the core 703 of the charge roller 701, the charge roller 701 charges the surface of the photoconductive drum 702. The power source 704 of FIG. 7(*a*) is a DC power source, which is connected between the photoconductive drum 702 and the charge roller 701. By contrast, as discussed earlier, FIG. 7(*b*) includes a power source 704 which includes an AC and a DC power source, which is connected between the photoconductive drum 702 and the charge roller 701. With the charge roller 701 in FIG. 7(*a*), the charge distribution is apt to be irregular, and in addition, the charge potential is extremely susceptible to ambient conditions, or variations in environmental conditions. With the roller 701 of FIG. 7(*b*), the cost of the apparatus is increased, and a large amount of ozone is generated.

As discussed earlier, although there have been various proposals to eliminate these problems, none of the proposals have been fully satisfactory.

Figure 8A:
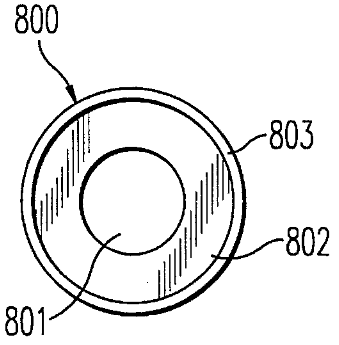
FIG. 8A PRIOR ART
FIGS. 8(*a*)–(*b*) are sections of a conventional charge roller.
Figure 8B:
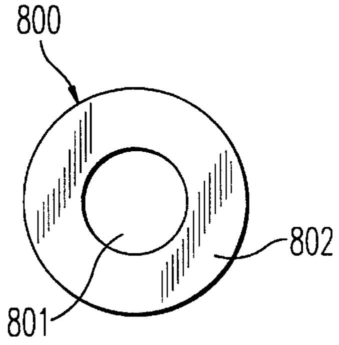
FIG. 8B PRIOR ART

FIG. 8(*a*) depicts the structure of a known charge roller 800. The charge roller 800 includes a metallic core 801, a conductive elastic layer 802 covering the core 801, with the elastic layer including a synthetic rubber having carbon dispersed therein. In addition, a surface layer 803 is provided to cover the elastic layer 802. FIG. 8(*b*) depicts the structure of a conventional charge roller 800 which includes a metallic core 801 and a conductive elastic layer 802 covering the core 801 formed of synthetic rubber having carbon dispersed therein.

Figure 1:
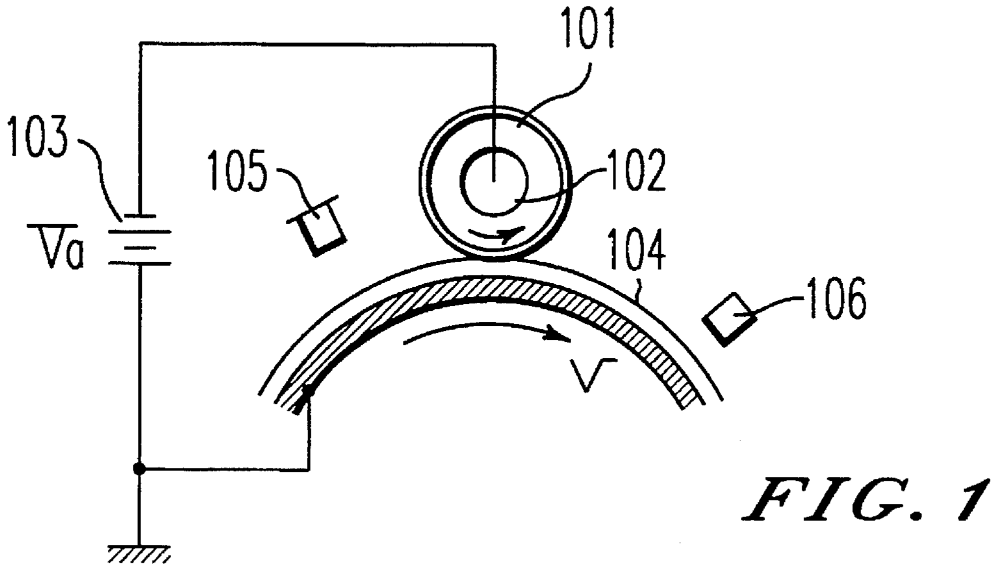
FIG. 1 is a side cross-sectional view of a device which can be utilized to test performance of an electrophotographic apparatus, particularly the characteristics of a charge roller.

The present invention will now be described, after first discussing an image forming apparatus equipped with an arrangement to test or evaluate the charge roller with respect to the charging characteristics thereof. As shown in FIG. 1, the apparatus includes a photoconductive drum 104, with a charge roller 101 held in contact with the photoconductive drum 104. The charge roller includes a metallic core 102. A power source 103 applies a DC voltage Va (of −1400 V) to the metallic core 102 of the charge roller 101. A discharge lamp 105 dissipates the charge remaining on the photoconductive drum 104 after (or downstream of) the image transfer. In addition, an electrometer 106 facing the center of the photoconductive drum 104 measures a charge potential Vs deposited on the surface of the photoconductive drum 104.

In operation, the drum 104 is rotated at a linear velocity v of 180 mm/sec by a suitable drive. The charge roller 101 is held in contact with and driven by the photoconductive drum 104. The remaining charge on the surface of the photoconductive drum 104 is dissipated by the discharge lamp 105. The power source 103 applies the DC voltage to the core 102 of the charge roller 101. The charge roller 101 charges the surface of the photoconductive drum 104 to a negative polarity in response to the voltage from the power source 103. The electrometer 106 measures the charge potential (Vs) deposited on the surface of the photoconductive drum 104.

Figure 2:
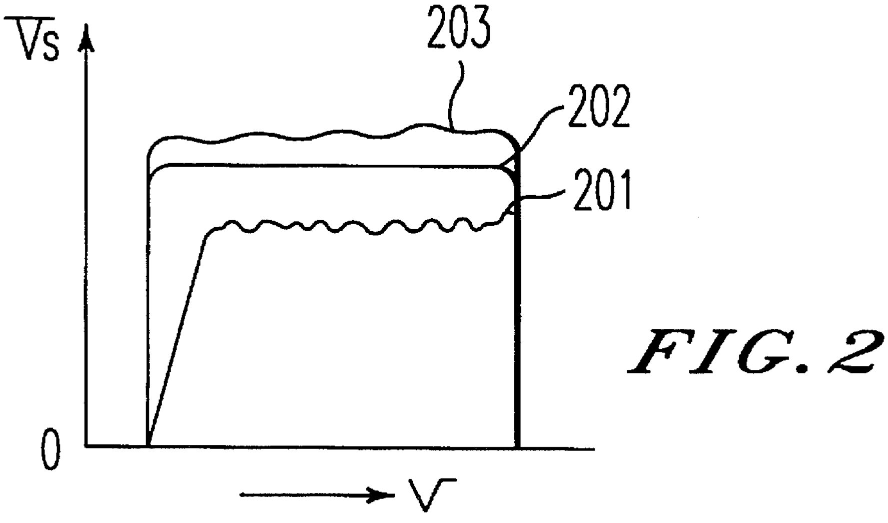
FIG. 2 is a graph representing charging characteristics of different types of charge rollers, which graphically represent characteristics can be obtained utilizing a testing device as depicted in FIG. 1.

With the FIG. 1 arrangement, the charge characteristics including the inclination upon charge-up, a level of the charge potential Vs, as well as the uniformity of the charge distribution can be determined via the electrometer 106. Thus, information obtained by the FIG. 1 arrangement can be graphically represented as shown in FIG. 2, to depict the charging characteristics of various charge rollers 101. The results for the various conditions or rollers are represented by curves 201–203, which will be described in further detail hereinafter.

Figure 3:
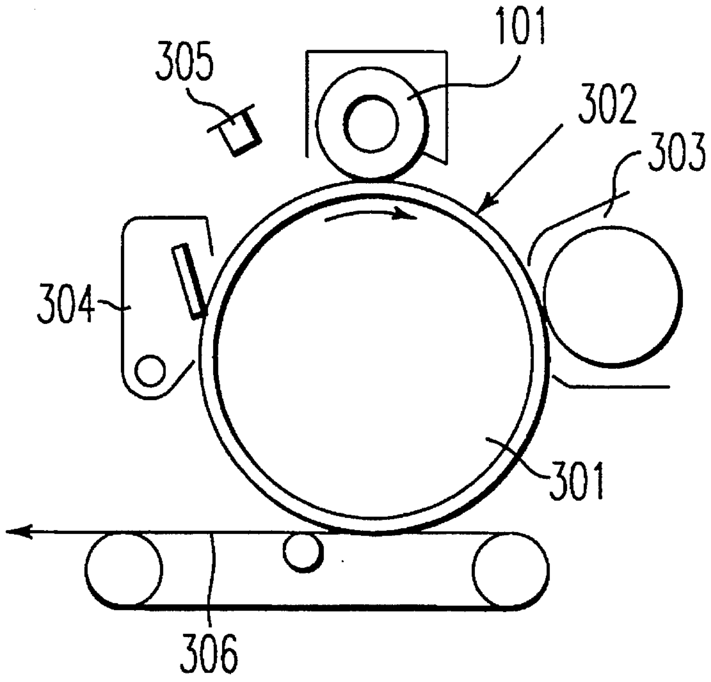
FIG. 3 is a side view schematically representing an image forming apparatus having a charge roller in accordance with the present invention.

FIG. 3 shows an image forming apparatus having a charge roller in accordance with the present invention. As shown in FIG. 3, the image forming apparatus includes a photoconductive drum 301, and disposed at an outer periphery of the photoconductive drum 301, a charging device is provided in the form of a charge roller 101. An image exposure device provides a light beam represented by arrow 302 to form a latent image on the photoconductive drum 301, with a developing device 303 developing the latent image with a toner or developer to form a toner image on the photoconductive drum 301. A transfer charger (not shown) transfers the toner image from the photoconductive drum 301 onto a transfer material, such as a sheet of paper. A cleaner 304 removes residual toner from the photoconductive drum 301, and a discharge lamp 305 provides light to the photoconductive drum 301 to remove residual charges. In addition, an image transfer belt 306 is provided, with an associated pair of feed rollers and a guide.

In operation, a voltage is applied to the charging device disposed in contact with the photoconductive drum 301, to thereby charge the surface of the photoconductive drum 301, and the drum is then exposed to the light beam 302, with the light beam corresponding to an original image thereby forming an electrostatic latent image on the photoconductive drum 301. Next, the electrostatic latent image formed on the photoconductive drum 301 is developed or visualized by toner or developer (contained in the developing device 303) adhering to the photoconductive drum 301 to form the toner image. The toner image is then transferred to the transfer material, typically a sheet of paper, which has been supplied by paper feed rollers, with the transfer occurring utilizing a transfer charger (not shown) and thus the toner image is provided on the transfer material. Any residual toner which remains on the photoconductive drum 301 is recovered by a cleaner 304. Since residual charges may remain on the photoconductive drum 301, the photoconductive drum 301 is preferably exposed to light by the discharge lamp 305 to remove the residual charge, such that the drum 301 is ready for the above-mentioned primary charging by the charging device for a next image forming operation. Thus, a copy image is formed by an electrophotographic process utilizing the apparatus of FIG. 3.

Figure 4:
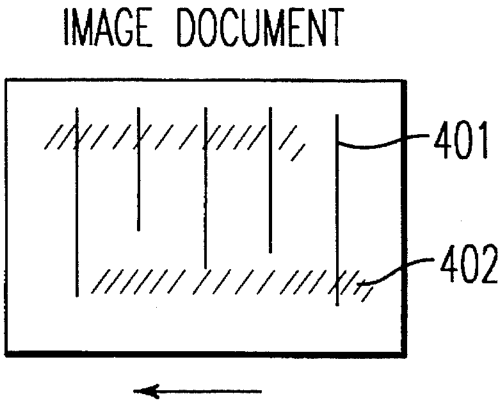
FIG. 4 depicts undesirable image aberrations including an irregular pattern formed on a sheet having an image formed thereon resulting from irregular charge distribution of the charge roller, as well as an undesirable lateral strip of toner caused by extended attachment or contact of the charge roller to the photoconductive drum.

Referring briefly to FIG. 4, undesirable images or image aberrations are shown which are characteristic or resultant from adherence of the charge roller to the photoconductive drum, and/or of the adherence of toner to the charge roller, which have been determined upon examination of the document upon which the image has been formed. The characteristic of undesirable adherence or non-binding characteristics of the charge roller with respect to the photoconductive drum appears in the form of an undesirable lateral strip of toner or developer 401 on the copy having the image formed thereon. This undesirable lateral strip 401 can be caused in conventional arrangements particularly as a result of extended engagement or contact of the charge roller to the photoconductive drum, for example, during extended periods during which the apparatus is not in operation. The poor adherence characteristic of the charge roller with respect to the toner is noticed by a charge irregularity pattern 402 appearing on the copied image document, which can be correlated with the charge roller/toner adherence characteristics after running tests. The charge irregularity pattern 402 is also caused by irregular charge distribution in the charge roller.

FIGS. 5(*a*)–(*e*) show sections of charge rollers of three prior art arrangements, a comparison example, and a preferred embodiment of the present invention. The charging characteristics of the charge roller are readily recognized by the graph drawn based upon information from the electrometer 106 of the testing device discussed earlier with reference to FIG. 1. As discussed herein, the performance of the charge roller will be described with reference to the charging characteristic which includes: (a) the level of the charge potential Vs; and (b) the uniformity of the charge distribution. In addition, the surface characteristics will be described, with the surface characteristics including: (a) the non-binding or non-adherence characteristics of the charge roller to the photoconductive drum; and (b) the adherence characteristics of the charge roller with respect to toner. As discussed earlier, the charge characteristics can be determined by the electrometer 106. The surface characteristics are determined by the appearance or lack of appearance of the undesirable lateral toner strip and charge irregularity patterns on the copy sheet formed during the image forming operation. The characteristics of the charge rollers of FIGS. 5(*a*)–(*e*) are shown in Table 1.

TABLE 1

| | Charging Characteristic | | | Surface Characteristic | | |
|---|---|---|---|---|---|---|
| | | | | Non-binding of | | |
| | Inclination of charge up | Level of charge potential (Vs) | Uniformity of charge distribution | charge roller to photoconductive drum | Non-binding of charge roller to toner | Production Cost |
| Prior Art '668 DC & AC | O | O | O | O | Δ | X |
| Prior Art '061 DC | Δ | X | X | O | OO | |
| Prior Art '985 DC & AC | O | O | O | X | X | X |
| Compare on embodiment DC | O | O | O | X | X | O |
| Present invention DC | O | O | O | O | O | O |

In the tables utilized herein, the 0 is utilized to denote a fully satisfactory or desired result, with the X denoting unsatisfactory results. The Δ denotes results which are marginally acceptable, but less than optimal or less than desired. FIG. 5(*a*) corresponds to the '668 arrangement discussed earlier, and includes a charge roller 800*a* having a metallic core 801*a*, a conductive elastic layer 802*a* covering the core 801*a*, and a surface layer 803*a* covering the elastic layer 802*a*. The conductive elastic layer 802*a* is a carbon-dispersed silicon rubber having a thickness of approximately 3 mm. The carbon-dispersed silicon has an electrical resistance of $10^4$ Ω-cm. The surface layer 803*a* is a nylon having a thickness of approximately 100 μm. The nylon has an electrical resistance of $10^{12}$ Ω-cm. The charge roller 800*a* requires a DC power source as well as an AC power source such that an AC voltage is superposed on the DC voltage.

Results obtained utilizing the FIG. 5(*a*) arrangement are shown in FIG. 2 (line 202) and in Table 1, which show satisfactory charging characteristics for the charge roller. As shown by line 202 of FIG. 2, the charge-up inclination is satisfactory, and the level of the charge potential Vs is high. In addition, as shown by the horizontal flatness of the line 202, a uniform charge distribution also results. As denoted in Table 1, the surface characteristics of the charge roller are good, as are the adherence, or more particularly the non-binding characteristics of the charge roller to the photoconductive drum, and the non-binding characteristic of the charge roller to toner is less than desireable. Although such an arrangement has generally satisfactory characteristics, as discussed earlier, the cost of this type of charge device is less than satisfactory.

FIG. 5(*b*) corresponds to the '061 arrangement in which the charge roller 800*b* has a metallic core 801*b*, a conductive elastic layer 802*b* covering the core 801*b*, and a surface layer 803 covering the elastic layer 802*b*. The conductive elastic layer 802*b* is a carbon-dispersed silicon rubber having a thickness of approximately 5 mm. The surface layer 803*b* is a resin containing fluorine, with the thickness of the resin approximately 50 μm. The charging device of this type requires only a DC power source. As shown in FIG. 2 (line 201) and Table 1, the charge roller has poor charging characteristics. Further, as shown by line 201, the charge-up inclination is only fair, the level of the charge potential Vs is low, and the charge distribution uniformity is poor as shown by the wavy or inconsistent horizontal line portion. The surface characteristics (including the adherence of toner to the charge roller, and the adherence of the drum and charge rollers) of the charge roller are generally good. Although this type of charge roller is relatively inexpensive, a lower quality performance is attained.

FIG. 5(*c*) corresponds to the '985 arrangement and includes a charge roller 800*c* having a metallic core 801*c* and a conductive elastic layer 802*c* covering the core 801*c*. The conductive elastic layer 802*c* is formed of a carbon-dispersed urethane rubber having an electrical resistance of $10^6$ Ω-cm. This type of charging device requires a DC power source as well as an AC power source to provide a superposed AC voltage on the DC voltage. The performance of this type of charging device is also represented by line 202, with the characteristics also shown in Table 1. The charging characteristics of the charge roller are generally satisfactory. In addition, as shown by line 202, the charge-up inclination is good, and a high charge potential level Vs is attained. In addition, a generally uniform charge distribution is achieved. However, as shown in Table 1, the surface characteristics of the charge roller are poor both from a standpoint of the adherence characteristics between the charge roller and the photoconductive drum, as well as the adherence characteristics of the charge roller with respect to the toner. Further, the cost of such a charging device is higher than desirable.

The FIG. 5(*d*) charge roller 800*d* includes a metallic core 801*d* and an elastic layer 802*d* covering the core 801*d*. The elastic layer 802*d* is a polar synthetic rubber, in particular an epichlorohydrein rubber having a thickness of approximately 3 mm, with the epichlorohydrein rubber having an electrical resistance of $10^8$ Ω-cm. This charging device requires only a DC power source. As shown in FIG. 2 (line 203) and in Table 1, the charging characteristics of the roller are generally good, as is the charge-up inclination. The level of the charge potential Vs is quite high, and a generally uniform charge distribution is provided. Thus, utilizing the epichlorohydrein rubber, generally satisfactory charging characteristics are provided. However, as shown in Table 1, the surface characteristics of the charge roller are less than satisfactory, both from a standpoint of the adherence or non-binding characteristics of the charge roller with respect to the photoconductive drum, and between the charge roller and the toner. Such a charge roller is relatively inexpensive.

FIG. 5(*e*) corresponds to a preferred embodiment of the present invention, with the charge roller 101 including a metallic core 102, a conductive elastic layer 107 covering the core 102, and a surface layer 108 covering the elastic layer 107. The conductive elastic layer 107 is a polar synthetic rubber, more particularly, an epichlorohydrein rubber having a thickness of 3 mm. The epichlorohydrein rubber has a resistance of $10^7$–$10^9$ Ω-cm. The surface layer 108 is nylon having a thickness of approximately 5–30 μm, with the nylon having an electrical resistance of $10^{10}$ Ω-cm. This type of charging device also requires only a DC power source. As shown in FIG. 2 (line 202) and also in Table 1, the charging characteristics of this roller are good, including a satisfactory charge-up inclination, a high charge potential level Vs, and a uniform charge distribution (as represented by the flatness of the line). In addition, the surface characteristics of the charge roller are fully satisfactory and desirable, both from a standpoint of the adherence or non-binding characteristics between the charge roller and photoconductive drum, as well as between the charge roller and the toner. In addition, the charge roller is relatively inexpensive.

Thus, as should be readily apparent from the foregoing, the present invention provides a charging arrangement for a photoconductive element which is fully satisfactory in terms of the charging characteristics as well as the surface characteristics of the charge roller, while also being fully acceptable from a cost standpoint. Further details of preferred embodiments will now be set forth with reference to the following illustrative examples.

EXAMPLE 1

A charge roller 101 is provided having a metallic core 102 with a diameter of 8 mm and a conductive elastic layer 107 having a diameter of 16 mm covering the metallic core, with the elastic layer formed of a polar synthetic rubber, in particular an epichlorohydrein rubber. The electrical resistance of the conductive elastic layer 107 is $3\times10^8$ Ω-cm, with a hardness of the conductive elastic layer 107 of 40 as defined by JISA (Japan Industrial Standard Type A K6301). To form the conductive elastic layer 107 of a thickness of 3 mm, the surface is mechanically ground by a grindstone. In addition, a ten-point mean surface roughness (i.e., an average surface roughness as determined at ten points or ten locations) Rd can be imparted to the conductive elastic layer by a mechanical grinding operation utilizing a grindstone. Three charge rollers each were prepared for surface roughnesses (Rd) of 3, 5, 10, 15, 20 and 30 μm, for a total of 18 rollers. A solution of polyamide resin (or nylon) is sprayed on the conductive elastic layer 107 with the polyamide resin then dried. The polyamide resin is formed to have a thickness of 5 μm, 10 μm and 30 μm for each roughness of the elastic layer 107.

The ten-point mean surface roughness (Rs) of the surface layer 108 is measured utilizing a universal surface shape-measuring machine (model: SE-3E manufactured by Kosaka Kenkyusho) according to the JISB (Japanese Industrial Standard Type B 0601).

The 18 charge rollers thus formed (i.e., for six roughnesses of the conductive elastic layer, and three resin thicknesses for each of the roughnesses) were then evaluated with respect to the charging characteristics and the surface characteristics of the charge roller 101. The results are shown in Table 2.

TABLE 2

| | | | 4 | | 7 | |
|---|---|---|---|---|---|---|
| 1 | 2 | 3 | 5 | 6 | 8 | 9 |
| 3 μm | 5 μm | 6 μm | 800 V | X | X | X |
| 5 μm | " | 5 μm | " | Δ | Δ | Δ |
| 10 μm | 5 μm | 5 μm | 800 V | ○ | Δ | Δ |
| 15 μm | " | 12 μm | " | ○ | Δ | Δ |
| 20 μm | " | 17 μm | " | X | Δ | Δ |
| 30 μm | " | 25 μm | " | X | Δ | Δ |
| 3 μm | 10 μm | 4 μm | 750 V | ○ | Δ | Δ |
| 5 μm | " | 4 μm | " | ○ | ○ | ○ |
| 10 μm | 10 μm | 6 μm | 750 V | ○ | ○ | ○ |
| 15 μm | " | 10 μm | " | ○ | ○ | ○ |
| 20 μm | " | 14 μm | " | X | ○ | Δ |
| 30 μm | " | 16 μm | " | X | ○ | Δ |
| 3 μm | 30 μm | 3 μm | 660 V | ○ | ○ | ○ |
| 5 μm | " | 3 μm | " | ○ | ○ | ○ |
| 10 μm | 30 μm | 5 μm | 660 V | ○ | ○ | ○ |
| 15 μm | " | 9 μm | " | Δ | ○ | ○ |
| 20 μm | " | 12 μm | " | X | ○ | Δ |
| 30 μm | " | 14 μm | " | X | ○ | Δ |

1 - Ten-point mean surface roughness of conductive elastic layer Rd (μm)
2 - Mean thickness of surface layer
3 - Ten-point mean surface roughness of surface layer Rs (μm)
4 - Charging characteristic
5 - Level of charge potential (Vs)
6 - Uniformity of charge distribution
7 - Surface characteristic
8 - Non-binding of charge roller to photoconductive drum
9 - Non-binding of charge roller to toner The ten-point mean surface roughness (Rs) of the surface layer 108 depends upon the ten-point mean surface roughness (Rd) of the surface of the conductive elastic layer 107. The ten-point mean surface roughness (Rs) of the surface layer 108 also depends upon the thickness of the surface layer 108 and the method of spraying.

Preferably, the thickness of the surface layer should be minimized, and the ten-point mean surface roughness (Rd) of the surface of the conductive elastic layer should also be minimized.

With regard to the charge characteristics, the thicker the surface layer 108, the lower the level of the charge potential. In addition, with increasing ten-point mean surface roughnesses (Rd) of the surface of the conductive elastic layer 107, the charge uniformity is diminished. However, when the ten-point mean surface roughness (Rd) of the surface of the conductive elastic layer 107 is less than 5 μm, the surface of the layer 108 should be mechanically ground using a tape or belt grinding method. However, the use of a tape or belt-grinding method increases the production cost of the charge roller 101. When both the ten-point mean surface roughness (Rd) of the surface of the conductive layer 107 and the thickness of the surface layer 108 become less than 5 μm, the surface characteristics of the charge roller 101 become poor.

As discussed earlier, the surface characteristics of the charge roller 101 include both the characteristic of the non-binding or non-adherence of the charge roller to the photoconductive drum, as well as the non-binding or non-adherence of the charge roller to toner. The greater the thickness of the surface layer 108, the better the surface characteristics become. By contrast, the charging characteristics deteriorate for increasing thicknesses of the surface layer 108.

Figure 6:
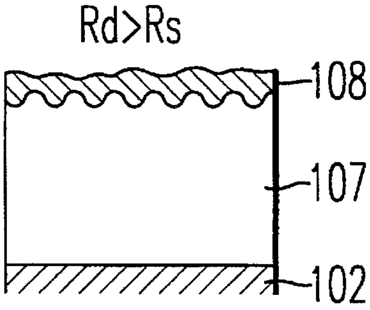
FIG. 6 is a section of a charge roller of the present invention.
Figure 5A:
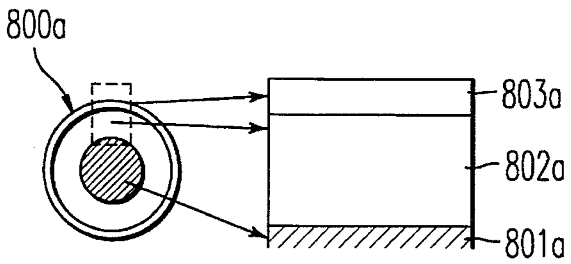
FIG. 5A PRIOR ART
FIGS. 5(*a*)–(*e*) shows sections of charge rollers of the prior art, a comparison example, and a preferred embodiment of the present invention.
Figure 5B:
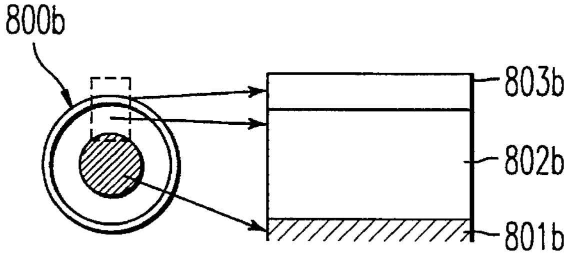
FIG. 5B PRIOR ART
Figure 5C:
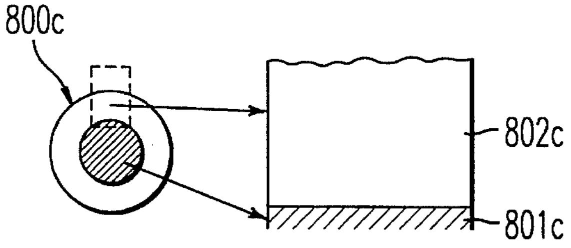
FIG. 5C PRIOR ART
Figure 5D:
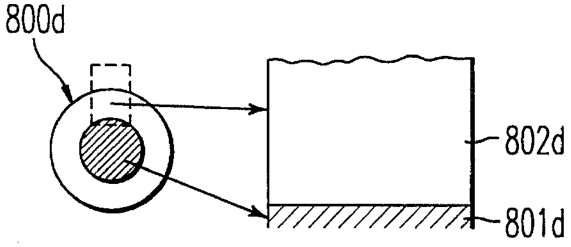
FIG. 5D PRIOR ART
Figure 5E:
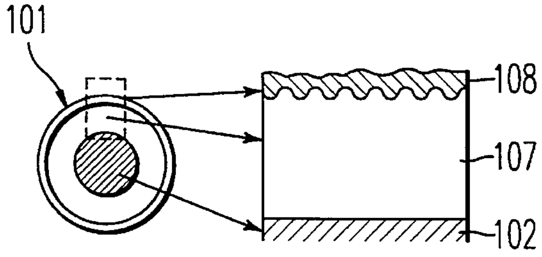
FIG. 5E PRIOR ART

Based upon the realization discussed above, and summarized in Table 2, in accordance with the present invention, optimal characteristics of a charge roller have been recognized. As shown in FIG. 6, the charge roller of the present invention, including a metallic core, a conductive layer, and a surface layer, preferably includes a conductive layer formed of epichlorohydrein rubber, with the ten-point mean surface roughness (Rd) of the epichlorohydrein rubber 5–15 μm. In addition, the surface layer is preferably in the form of a polyamide resin having a mean thickness of less than twice the ten-point mean surface roughness (Rd) of the epichlorohydrein rubber.

The conductive elastic layer is preferably coated with the surface layer by a spraying method such that the ten-point mean surface roughness (Rs) of the polyamide resin is less than the ten-point mean surface roughness (Rd) of the epichlorohydrein rubber, and also with the ten-point mean surface roughness (Rs) of the polyamide resin 3–12 μm.

Referring briefly to FIG. 5(*e*), as should be readily apparent, with the surface layer and conductive elastic layer having the above construction, the surface layer can have a varying thickness with the maximum thickness occurring in the radially smallest or trough areas of the conductive elastic layer, and the minimum thicknesses occurring in the radially larger or peak areas of the conductive elastic layer.

With the above structure, the charging characteristics and the surface characteristics of the charge roller are all desirable and satisfactory. In addition, when the ten-point mean surface roughness (Rd) of the epichlorohydrein rubber is 5–15 μm, the production costs associated with surface grinding are satisfactorily minimized.

EXAMPLE 2

As in the first example, the charge rollers of the second illustrative example include a metallic core 102 with a diameter of 8 mm and a conductive elastic layer 107 having a thickness diameter of 16 mm covering the metallic core formed of a polar synthetic rubber, however in this case, a urethane rubber is utilized having an electrical resistance of $3\times10^9$ Ω-cm. The hardness of this elastic layer is 40 as defined by JISA (Japan Industrial Standard Type A K6301). The conductive elastic layer of the charge roller is mechanically ground with a grindstone to provide a thickness of 3 mm. The conductive elastic layer 107 of the charge roller 101 is formed to have a ten-point mean surface roughness (Rd) of 10 μm by a mechanical grinding operation using a grindstone. In addition, the urethane rubber is formed to have to moderate or medium electrical resistance by dispersing an alkali metal salt into the urethane rubber. The conductive elastic layer formed of urethane rubber with dispersed alkali metal salt can thus attain a uniform electrical charge distribution. By contrast, a conductive elastic layer made of a synthetic rubber with a conductive particle such as carbon cannot attain the same uniformity with regard to the electrical distribution on the conductive elastic layer. Japanese Patent Laid-Open Publication No. 189876/1988 describes a urethane rubber having an alkali metal salt of the type under consideration. A particularly suitable material includes a per halogen oxyacid salt for the conductive particle of an alkali metal salt. For example, when lithium perchlorate (0.05 wt %) is applied to the urethane rubber, the electrical resistance of the conductive elastic layer lowers by a factor of approximately 10, such that the elastic layer has an electrical resistance of $3\times10^8$ Ω-m.

The surface layer 108 of the charge roller 101 is formed of six parts of copolymer-nylon and 100 parts of methanol which are mixed together. The solution of copolymer-nylon and methanol is applied on the urethane rubber by a dipping method, and the solution of the copolymer-nylon and methanol is dried to form the surface layer 108. The surface layer is thus applied having a mean thickness of 7 μm, and a ten-point mean surface roughness (Rs) of the surface layer is 6 μm.

Utilizing a testing arrangement as discussed earlier with reference to FIG. 1, the characteristics of the roller were evaluated utilizing a DC voltage Va of −1500 V applied to the metallic core 102, and with the electrometer 106 measuring a charge potential Vs of −600 to −620 V deposited on the surface of the photoconductive drum 104. The thickness of the film formed on the optical (OPC) photoconductive drum 104 is 28 μm.

The charging characteristics were fully satisfactory, including a good charge-up inclination with a relatively high charge potential Vs—almost as high as the highest embodiment observed. More specifically, compared with the level of the charge potential Vs of the charge roller 101 having a conductive layer 107 of epichlorohydrein rubber, the magnitude of the charge potential Vs of the charge roller 101 having the conductive elastic layer 107 of urethane rubber is slightly lower by about 150 V for the same measuring conditions. The electrical resistance of the urethane rubber is higher than that of epichlorohydrein rubber by a factor of approximately 10. If the DC voltage Va to the metallic core 102 of the charge roller having the conductive elastic layer of urethane increases to −1600 V from −1500 V, there are no resulting technical problems, and the desired charge level can be achieved while uniformity of the charge distribution remains satisfactory.

Utilizing an image forming apparatus as shown in FIG. 3, the surface characteristics of the charge roller 101 were evaluated by successive copying of 10,000 sheets in a running test. The non-binding characteristic of the charge roller with respect to the photoconductive drum was good and abnormal images such as an undesirable lateral strip were not produced during the running test. Thus, the non-binding or non-adhering characteristic of the charge roller with respect to the toner was determined to be satisfactory. Further, even if the charge potential Vs deposited on the surface of the photoconductive drum 104 is lowered as a result of dirt on the surface of the charge roller 101, an abnormal image is not produced.

A polyvinyl butyral resin, and a polyvinyl alcohol resin, in addition to the polyamide resin are considered as suitable for the resin of the surface layer 108. These resins are synthetic resins which are soluble in alcohol.

EXAMPLE 3

As in the earlier examples, the charge roller 101 of the third example includes a metallic core 102 having a diameter of 8 mm, with a conductive elastic layer 107 having a diameter of 16 mm covering the metallic core 102 and formed of a polar synthetic rubber, namely epichlorohydrein rubber. The electrical resistance of the conductive elastic layer is $3\times10^8$ Ω-cm, with the hardness 40 as defined by JISA. The conductive elastic layer 107 is formed of a thickness of 3 mm by a mechanical grinding operation using a grindstone. In addition, to form the conductive elastic layer 107 of the charge roller 101 with a ten-point mean surface roughness (Rd) of 10 μm, the surface of the conductive elastic layer 107 is mechanically ground utilizing a grindstone. Further, to form the surface layer 108 of the charge roller 101, a resin which contains fluorine (10.8 wt % of solid) is diluted with toluel. The solution of the resin and the toluel is applied to the epichlorohydrein rubber by a spraying method, and the fluorine resin and toluel is dried to form the surface layer 108. The mean thickness of the thin film (surface layer 108) is formed to be 6 μm, with the ten-point mean surface roughness (Rs) of the surface layer 7.5 μm.

The charging characteristics of the charge roller 101 were then measured utilizing a testing device as shown in FIG. 1, with a photoconductive drum having a thin film formed thereon of 28 μm. With a power source applying a DC voltage Va of −1500 V to the metallic core 102 of the charge roller, the electrometer 106 measured a charge potential Vs of −770 V deposited on the surface of the photoconductive drum 104. The charging characteristics of the charge roller 101 were good, including a good charge-up inclination and a high charge potential level Vs, as well as a uniform charge distribution.

The surface characteristics of the charge roller 101 were also determined utilizing an image forming apparatus as shown in FIG. 3, with a successive running copying test of 20,000 sheets. The non-binding characteristics of the charge roller to the photoconductive drum were considered to be good, and abnormal images such as an undesirable lateral strip of toner were not produced during the running test. In addition, the non-binding or non-adherence characteristics of the charge roller with respect to toner were considered to be good, and the non-binding characteristics of the charge roller to toner were considered as particularly improved using the fluorine resin as the surface layer 108.

A silicon resin, urethane resin, acrylic resin, polyethylene resin and polyamide resin may also be utilized as a replacement for the fluorine resin in the surface layer 108. These resins also provide suitable surface characteristics, particularly with respect to the non-adherence of toner to the charge roller.

EXAMPLE 4

As with the earlier embodiments, the charge roller 101 includes a metallic core 102 with a diameter of 8 mm and a conductive layer 107 having a diameter of 16 mm covering the metallic core 102. The conductive elastic layer is formed of a polar synthetic rubber, more particularly epichlorohydrein rubber having an electrical resistance of $3\times10^8$ Ω-cm. The hardness of the elastic layer is 40 as defined by JISA. The conductive elastic layer is formed of a thickness of 3 mm by a mechanical grinding operation using a grindstone.

In the fourth example, a mechanical grinding operation was also utilized to form a ten-point mean surface roughnesses (Rd) of 5, 10 and 15 μm. Thus, three charge rollers were prepared having the different roughnesses.

The surface layer 108 was formed by providing 100 parts of a solution of epichlorohydrein rubber (2.5 wt % of solid), 80 parts of a solution of fluorine resin (10.8 wt % of solid), and 0.6 parts of silica mixed with toluel. The solution of epichlorohydrein rubber, the fluorine resin, silica and toluel is applied to the epichlorohydrein rubber with a spraying method, and thereafter dried to form the surface layer 108. The mean thickness of the thin film is 8–10 μm.

The three charge rollers 101 were evaluated with respect to the ten-point mean surface roughness (Rs) of the surface layer 108, the charging characteristic of the charge roller 101, and the surface characteristics of the charge roller. The results are shown below in Table 3.

TABLE 3

| | | | 4 | | 7 | |
|---|---|---|---|---|---|---|
| 1 | 2 | 3 | 5 | 6 | 8 | 9 |
| 5 μm | 8 μm | 4 μm | 800 V | O | O | O |
| 10 μm | 8 μm | 7 μm | 800 V | O | O | O |
| 15 μm | 10 μm | 10 μm | 780 V | O | O | O |

1 - Ten-point mean surface roughness of conductive elastic layer Rd
2 - Mean thickness of surface layer
3 - Ten-point mean surface roughness of surface layer Rs
4 - Charging characteristic
5 - Level of charge potential (Vs)
6 - Uniformity of charge distribution
7 - Surface characteristic
8 - Non-binding of charge roller to photoconductive drum
9 - Non-binding of charge roller to toner The ten-point mean surface roughness Rs of the surface layer 108 was 4–10 μm. The charging characteristics were determined utilizing a testing device discussed earlier with reference to FIG. 1. Utilizing a power source 103 to apply a DC voltage Va of −1500 V to the metallic core 102, the electrometer 106 measured a charge potential Vs of −780 V to −800 V deposited on the surface of the photoconductive drum. The charging characteristics of the charge roller were considered to be good for each of the surface roughnesses, including a good charge-up inclination and a high level of charge potential Vs. In addition, a uniform charge distribution was observed.

The surface characteristics were also observed utilizing the arrangement of FIG. 3, with a successive running test performed copying 10,000 sheets. The non-binding characteristics of the charge roller to the photoconductive drum were considered to be good, and abnormal images such as an image having an undesirable lateral toner strip were not produced. Further, even though an extended inoperative period occurred prior to production of the first copy, an abnormal image such as an undesirable lateral strip was not observed. In addition, the non-binding or non-adherence characteristics of toner to the charge roller were considered to be good.

In addition to silica discussed earlier, a zinc oxide, titanium oxide or a tin oxide are suitable for mixing in the above solution.

EXAMPLE 5

In the fifth example, the charge roller again includes a metallic core 102 having a diameter of 8 mm, with a conductive elastic layer having a diameter of 16 mm covering the metallic core and formed of a polar synthetic rubber formed of epichlorohydrein rubber. The electrical resistance of the conductive layer was $3\times10^8$ Ω-cm, with a hardness of 40 defined by JISA. The conductive elastic layer was formed to a thickness of 3 mm by a mechanical grinding operation, and the conductive elastic layer was formed to have a ten-point mean surface roughness (Rd) of 10 μm with a mechanical grinding operation using a grindstone.

The surface layer 108 was formed utilizing 100 parts of a solution of fluorine resin (10.8 wt % of solid) and 4 parts of a tin oxide mixed with toluel. The solution of the fluorine resin, tin oxide and toluel was applied to the epichlorohydrein rubber by a spraying method, which was thereafter dried. The mean thickness of the thin film was 6 μm, with the ten-point mean surface roughness (Rs) 8 μm.

Upon application of a DC voltage Va of −1500 V by a power source 103 to the metallic core 102, the electrometer 106 measured a charge potential Vs of −790 V deposited on the surface of the photoconductive drum 104. The charging characteristics of the roller were considered good including a good charge-up inclination and a high charge potential Vs, with a uniform charge distribution also achieved. The inclusion of the tin oxide in the above-mentioned solution was considered to particularly improve the charge distribution uniformity.

With a running test performed by successive copying of 30,00 sheets, the surface characteristics were observed, and the non-binding or non-adherence of the charge roller with respect to the photoconductive drum, as well as the non-binding characteristics of the charge roller with respect to the toner were considered good, and abnormal images such as an undesirable lateral strip were not produced. The surface characteristic of the charge roller was particularly considered to be improved by the fluorine resin and the tin oxide in the surface layer 108.

EXAMPLE 6

The sixth example also included a metallic core having a diameter of 8 mm and a conductive elastic layer having a diameter of 16 mm, with the elastic layer 107 formed of a polar synthetic rubber, particularly epichlorohydrein rubber with an electrical resistance of $3\times10^8$ Ω-cm and a hardness of 40 as defined by JISA. The thickness of the conductive elastic layer was 3 mm by a mechanical grinding operation.

In addition, a mechanical grinding operation with a grindstone was utilized to provide a ten-point mean surface roughness (Rd) of 10 μm. The surface layer 108 of the charge roller 101 was formed utilizing 100 parts of a silicon resin (20 wt % of solid), and three parts of a carbon mixed with toluol. The solution of the silicon resin, carbon and toluol was then applied to the epichlorohydrein rubber by spraying with the layer thereafter allowed to dry. The mean thickness of the thin film was 7 μm, with a ten-point mean surface roughness (Rs) of the surface layer 108 of 7.5 μm.

Utilizing the FIG. 1 apparatus, and applying a DC voltage Va of −1500 V to the metallic core 102, the electrometer 106 measured a charge potential Vs of −780 V deposited on the surface of the photoconductive drum 104 (with the thickness of the thin film on the OPC photoconductive drum of 28 μm). The charging characteristics of the charge roller 101 were considered good including desirable charge-up inclination and a high charge potential Vs, as well as a uniform charge distribution.

A successive running test was also performed copying 25,000 sheets utilizing the FIG. 3 apparatus, and the non-binding characteristics of the charge roller and photoconductive drum were considered to be good, as were the non-binding characteristics of the charge roller with respect to the toner. Abnormal images such as an undesirable lateral strip were not observed.

Obviously, numerous additional modifications and variations of the present invention are possible in light of the above teachings. It is therefore to be understood that within the scope of the appended claims, the invention may be practiced otherwise than as specifically described herein.

What is claimed as new and is desired to be secured by letters patent of the U.S. is:

1. A charge roller for an image forming apparatus in which the charge roller charges a photoconductive member, the charge roller including a metallic core, a conductive elastic layer covering the metallic core, and a surface layer covering the conductive elastic layer;

wherein a ten-point mean surface roughness Rd of the conductive elastic layer and a surface roughness Rs of the surface layer satisfy the following relationships:

$$Rd>Rs,$$

$$5\ \mu m<Rd<15\ \mu m.$$

2. The charge roller of claim 1 in an image forming apparatus which comprises a photoconductive member, an image exposure means for providing a light beam to form a latent image on the photoconductive member, a developing device for developing the latent image with a toner or developer to form a toner image on the photoconductive member, a transfer charger for transferring the toner image from the photoconductive member onto a transfer material, a cleaner for removing residual toner from the photoconductive member, and a discharge member for providing light to the photoconductive member.

3. The charge roller of claim 2, wherein the surface roughness Rd of the conductive elastic layer and the surface roughness Rs of the surface layer are ten-point mean surface roughnesses.

4. The charge roller of claim 1, wherein a thickness of the surface layer is less than twice a surface roughness Rd of the conductive elastic layer.

5. The charge roller of claim 1, wherein a thickness of the surface layer is 5–30 μm.

6. The charge roller of claim 1, further including a power source, wherein the power source is a DC power source.

7. A charge roller for an image forming apparatus in which the charge roller charges a photoconductive member, the charge roller including a metallic core, a conductive elastic layer covering the metallic core, and a surface layer covering the conductive elastic layer;

wherein a surface roughness Rd of the conductive layer and a surface roughness Rs of the surface layer satisfy the following relationships:

$$5\ \mu m<Rd<15\ \mu m,$$

$$Rd>Rs,$$

$$3\ \mu m<Rs<10\ \mu m;$$

and wherein the conductive elastic layer has a hardness of at least 40 defined by JISA (Japanese Industrial Standard type A K6301).

8. The charge roller of claim 7 in an image forming apparatus which comprises a photoconductive member, an image exposure means for providing a light beam to form a latent image on the photoconductive member, a developing device for developing the latent image with a toner or developer to form a toner image on the photoconductive member, a transfer charger for transferring the toner image from the photoconductive member onto a transfer material, a cleaner for removing residual toner from the photoconductive member, and a discharge member for providing light to the photoconductive member.

9. The charge roller of claim 7, wherein the surface roughness Rd of the conductive elastic layer and the surface roughness Rs of the surface layer are ten-point mean surface roughnesses.

10. A charge roller for an image forming apparatus in which the charge roller charges a photoconductive member, the charge roller including a metallic core, a conductive elastic layer covering the metallic core, and a surface layer covering the conductive elastic layer;

wherein a surface roughness Rd of the conductive elastic layer and a surface roughness Rs of the surface layer satisfy the following relationships:

5 μm<Rd<15 μm,

3 μm<Rs<10 m, and

Rd>Rs.

11. The charge roller of claim 10 in an image forming apparatus which comprises a photoconductive member, an image exposure means for providing a light beam to form a latent image on the photoconductive member, a developing device for developing the latent image with a toner or developer to form a toner image on the photoconductive member, a transfer charger for transferring the toner image from the photoconductive member onto a transfer material, a cleaner for removing residual toner from the photoconductive member, and a discharge member for providing light to the photoconductive member.

12. The charge roller of claim 10, wherein the surface roughness Rd of the conductive elastic layer is a ten-point mean surface roughness.

13. The charge roller of claim 10, wherein the conductive elastic layer has a thickness of 1–5 mm, and wherein the conductive elastic layer is a polar synthetic rubber.

14. The charge roller of claim 13, wherein the polar synthetic rubber is epichlorohydrein rubber.

15. The charge roller of claim 13, wherein the polar synthetic rubber is urethane rubber.

16. The charge roller of claim 13 in an image forming apparatus which comprises a photoconductive member, an image exposure means for providing a light beam to form a latent image on the photoconductive member, a developing device for developing the latent image with a toner or developer to form a toner image on the photoconductive member, a transfer charger for transferring the toner image from the photoconductive member onto a transfer material, a cleaner for removing residual toner from the photoconductive member, and a discharge member for providing light to the photoconductive member.

17. The charge roller of claim 13, wherein the surface roughness Rd of the conductive elastic layer is a ten-point mean surface roughness.

18. A charge roller for an image forming apparatus in which the charge roller charges a photoconductive member, the charge roller including a metallic core, a conductive elastic layer covering the metallic core, and a surface layer covering the conductive elastic layer;

wherein the conductive elastic layer is a polar synthetic rubber with an electrical resistance of $10^7$–$10^{10}$ Ω-cm;

wherein a surface roughness Rd of the conductive elastic layer satisfies the following relationship:

5 μm<Rd<15 μm;

and a power source, wherein said power source is a DC power source.

19. The charge roller of claim 18 in an image forming apparatus which comprises a photoconductive member, an image exposure means for providing a light beam to form a latent image on the photoconductive member, a developing device for developing the latent image with a toner or developer to form a toner image on the photoconductive member, a transfer charger for transferring the toner image from the photoconductive member onto a transfer material, a cleaner for removing residual toner from the photoconductive member, and a discharge member for providing light to the photoconductive member.

20. The charge roller of claim 18, wherein the surface roughness Rd of the conductive elastic layer is a ten-point mean surface roughness.

21. A charge roller for an image forming apparatus in which the charge roller charges a photoconductive member, the charge roller including a metallic core, a conductive elastic layer covering the metallic core, and a surface layer covering the conductive elastic layer;

wherein the conductive elastic layer has a hardness defined by JISA (Japan Industrial Standard type A K6301) of at least 40; and wherein a surface roughness Rd of the conductive elastic layer satisfies the following relationship:

5 μm<Rd<15 μm.

22. The charge roller of claim 21 in an image forming apparatus which comprises a photoconductive member, an image exposure means for providing a light beam to form a latent image on the photoconductive member, a developing device for developing the latent image with a toner or developer to form a toner image on the photoconductive member, a transfer charger for transferring the toner image from the photoconductive member onto a transfer material, a cleaner for removing residual toner from the photoconductive member, and a discharge member for providing light to the photoconductive member.

23. The charge roller of claim 21, wherein the surface roughness Rd of the conductive elastic layer is a ten-point mean surface roughness.

24. A charge roller for an image forming apparatus in which the charge roller charges a photoconductive member, the charge roller including a metallic core, a conductive elastic layer covering the metallic core, said conductive elastic layer including a conductive rubber material, and a surface layer covering the conductive elastic layer;

wherein a surface roughness Rs of the surface layer is 3–10 μm, and wherein a surface roughness Rd of the conductive elastic layer is 5–15 μm.

25. The charge roller of claim 24, wherein the surface roughness Rs is a ten-point mean surface roughness.

26. A charge roller for an image forming apparatus in which the charge roller charges a photoconductive member, the charge roller including a metallic core, a conductive elastic layer covering the metallic core, and a surface layer covering the conductive elastic layer;

wherein the surface layer has an electrical resistance of $10^9$–$10^{12}$ Ω-cm; and wherein said conductive elastic layer has a surface roughness such that said conductive elastic layer includes peak areas and trough areas, and wherein said surface layer is a thin film formed of a non-adhesive resin, said surface layer having a varying thickness with a maximum thickness disposed above said trough areas and a minimum thickness disposed above said peak areas; and wherein a thickness of the surface layer is 5–30 μm.

* * * * *